US009240506B2

(12) United States Patent
Werne et al.

(10) Patent No.: US 9,240,506 B2
(45) Date of Patent: Jan. 19, 2016

(54) TRANSPARENT CERAMIC PHOTO-OPTICAL SEMICONDUCTOR HIGH POWER SWITCHES

(75) Inventors: Roger W. Werne, San Ramon, CA (US); James S. Sullivan, Livermore, CA (US); Richard L. Landingham, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 1396 days.

(21) Appl. No.: 12/633,671

(22) Filed: Dec. 8, 2009

(65) Prior Publication Data

US 2011/0133203 A1 Jun. 9, 2011

(51) Int. Cl.
| | |
|---|---|
| *H01L 29/15* | (2006.01) |
| *H01L 31/0352* | (2006.01) |
| *C04B 35/575* | (2006.01) |
| *C04B 35/58* | (2006.01) |
| *C04B 35/581* | (2006.01) |
| *C04B 35/626* | (2006.01) |
| *C04B 35/645* | (2006.01) |

(Continued)

(52) U.S. Cl.
CPC .... *H01L 31/035209* (2013.01); *C04B 35/5755* (2013.01); *C04B 35/58* (2013.01); *C04B 35/581* (2013.01); *C04B 35/6263* (2013.01); *C04B 35/6269* (2013.01); *C04B 35/62635* (2013.01); *C04B 35/62665* (2013.01); *C04B 35/645* (2013.01); *H01L 31/08* (2013.01); *H01L 31/1812* (2013.01); *H01L 31/1848* (2013.01); *H01L 31/1864* (2013.01); *C04B 2235/3239* (2013.01); *C04B 2235/3262* (2013.01); *C04B 2235/3272* (2013.01); *C04B 2235/3895* (2013.01); *C04B 2235/5445* (2013.01); *C04B 2235/6023* (2013.01); *C04B 2235/666* (2013.01); *C04B 2235/77* (2013.01); *C04B 2235/9653* (2013.01); *Y02E 10/544* (2013.01)

(58) Field of Classification Search
CPC .............. H01L 2224/023; H01L 23/34; H01L 23/3675; H01L 23/3736; H01L 23/49827
USPC ........................ 257/76, 77, E29.068, E31.002
See application file for complete search history.

(56) References Cited

U.S. PATENT DOCUMENTS

| 6,194,699 B1 * | 2/2001 | Bernhoff et al. ........ 250/214 LS |
| 6,252,221 B1 * | 6/2001 | Kaneko et al. .......... 250/214 LS |
| 7,850,933 B2 * | 12/2010 | Yang et al. ...................... 423/1 |

(Continued)

OTHER PUBLICATIONS

Paschotta, Dr. Rudiger, "Encyclopedia of Laser Physics and Technology: Photoconductive Switches", RP Photonics Consulting GmbH, Jul. 10, 2008, http://rp-photonics.com/photoconductive_switches.html, 1 page.

(Continued)

*Primary Examiner* — Andy Huynh
(74) *Attorney, Agent, or Firm* — Zilka-Kotab, P.C.

(57) ABSTRACT

A photoconductive semiconductor switch according to one embodiment includes a structure of sintered nanoparticles of a high band gap material exhibiting a lower electrical resistance when excited by light relative to an electrical resistance thereof when not exposed to the light. A method according to one embodiment includes creating a mixture comprising particles, at least one dopant, and at least one solvent; adding the mixture to a mold; forming a green structure in the mold; and sintering the green structure to form a transparent ceramic. Additional system, methods and products are also presented.

27 Claims, 2 Drawing Sheets

(51) Int. Cl.
 *H01L 31/08* (2006.01)
 *H01L 31/18* (2006.01)

(56) References Cited

U.S. PATENT DOCUMENTS

| | | | | |
|---|---|---|---|---|
| 7,851,336 | B2 * | 12/2010 | Poplavskyy et al. | 438/479 |
| 7,923,368 | B2 * | 4/2011 | Terry et al. | 438/660 |
| 2004/0137710 | A1 * | 7/2004 | Grigoropoulos et al. | 438/622 |
| 2009/0053878 | A1 * | 2/2009 | Kelman et al. | 438/509 |

OTHER PUBLICATIONS

Sullivan et al., "Wide Bandgap Extrinsic Photoconductive Switches", U.S. Department of Energy by the University of California, Lawrence Livermore Laboratory, TPS Paper 1945, Sep. 25, 2007, pp. 1-6.

Sullivan et al., "6H-SiC Photoconductive Switches Triggered at Below Bandgap Wavelengths" Lawrence Livermore National Laboratory, Feb. 22, 2007.

"Large Transparent Ceramic Components for Compact High-Power Lasers" 2007 R&D 100 Award Entry, Feb. 1, 2007.

"Cree confirms 4-inch SiC switch under USAF deal" Compound Semiconductor.Net, Sep. 15, 2005.

Sampayan et al., "Development of Compact Pulsed Power for the Dielectric Wall/Accelerator (DWA)" Lawrence Livermore National Laboratory.

Non-Final Office Action from U.S. Appl. No. 13/843,863 dated Apr. 8, 2014.

Final Office Action from U.S. Appl. No. 13/843,863 dated Nov. 10, 2014.

Final Office Action from U.S. Appl. No. 13/843,863, dated Nov. 19, 2015.

* cited by examiner

TRANSPARENT CERAMIC PHOTO-OPTICAL SEMICONDUCTOR HIGH POWER SWITCHES

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to transparent ceramics, and particularly, to transparent ceramic photo-optical semiconductor switches.

BACKGROUND

Materials generally exhibit a certain band gap related to the material's physical and electronic properties. A band gap is specific to each solid material, and may be defined as an energy range in which there exists no electron state for placement of electrons. The band gap is described herein in terms of the energy difference (in electron volts eV) between the valence band and the conduction band for a material. The lower the band gap, the easier it is to ionize a material, e.g., by removing an electron.

High band gap materials, particularly semiconductors, are useful in photoconductive semiconductor switch (PCSS) applications. How high the band gap must be before the material is considered a "high band gap" material depends on what application the material is being used for. Generally, a high band gap material can be considered any material having an electronic band gap larger than about 1.0 eV. However, in some application, materials with an electronic band gap of larger than about 2.0 eV or more may be considered high band gap materials.

In addition to a high band gap, materials that are useful as PCSS material have high critical electrical strength, high electron saturation velocity, high thermal conductivity, and low "on resistance" when excited by a laser, or other optical source, with the proper wavelength and power.

Conventional materials that are used in PCSS applications include 6H-silicon carbide (SiC), 4H—SiC, and 2H-gallium nitride (GaN). 6H—SiC and 2H—GaN have wide band-gaps (3.0-3.4 eV), high critical field strength (3.0-3.5 MV/cm) and high-saturated electron velocity ($2.0$-$2.5 \times 10^7$ cm/s). These material properties make semi-insulating 6H—SiC and GaN attractive semiconductor materials for PCSS applications. Previous SiC PCSS work used high resistivity, low impurity SiC polytypes and focused on lateral geometry surface switches that used above band-gap wavelengths of light to trigger the switches.

These materials must be obtained somehow, either through purchase or creation. The problem with purchasing these materials for PCSS applications is that these materials are very expensive and relatively difficult to obtain. Moreover, if these materials are grown, other problems exist. In order to grow a crystal to sufficient size so that it can be cut into the source material for a specific PCSS application requires a lengthy crystal growing process. In addition, the crystal growing process is difficult to control, and frequently leads to crystal boules with significant imperfections, such as "pipes," inclusions, impurities, and/or other defects, which reduce the useful yield of the boule itself and yields a final crystal product with less than desirable performance characteristics, especially in optical applications, such as PCSS applications.

Since it is difficult to find all of the desired properties in a single material which can be used in PCSS application in a cost efficient way, it would be desirable to have methods to make materials that can be used in PCSS applications and/or to have additional materials capable of being used in PCSS applications that can be manufactured and/or produced more inexpensively and precisely than conventionally used materials.

SUMMARY

A photoconductive semiconductor switch according to one embodiment includes a structure of sintered nanoparticles of a high band gap material exhibiting a lower electrical resistance when excited by light relative to an electrical resistance thereof when not exposed to the light.

A method according to one embodiment includes creating a mixture comprising particles, at least one dopant, and at least one solvent; adding the mixture to a mold; forming a green structure in the mold; and sintering the green structure to form a transparent ceramic.

Other aspects and embodiments of the present invention will become apparent from the following detailed description, which, when taken in conjunction with the drawings, illustrate by way of example the principles of the invention.

DETAILED DESCRIPTION

Figure 1:
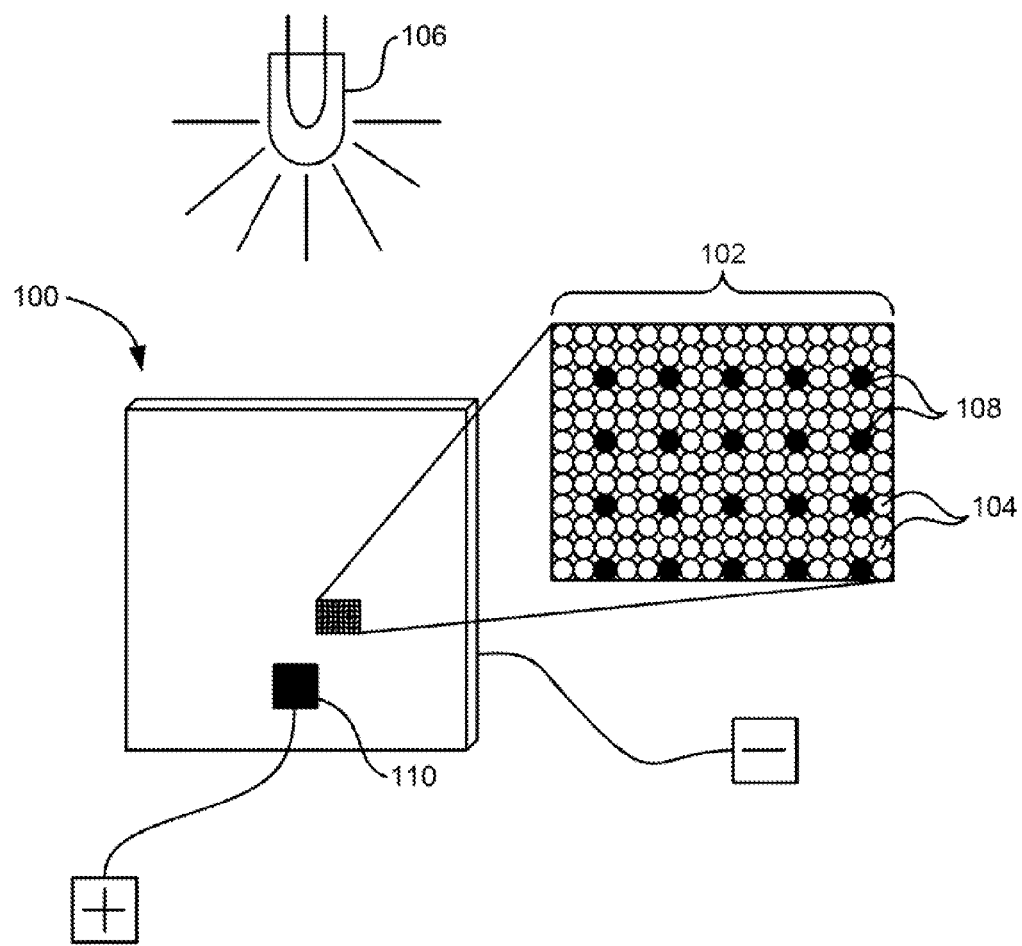
FIG. 1 is a schematic diagram of a structure that can be used in photoconductive semiconductor switch applications, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

As used herein, the term "about" when combined with a value refers to plus and minus 10% of the reference value. For example, a length of about 1000 nm refers to a length of 1000 nm±100 nm, a temperature of about 50° C. refers to a temperature of 50° C.±5° C., etc.

Disclosed herein, according to some embodiments, is a method for fabricating a transparent ceramic structure for use in photoconductive semiconductor switch (PCSS) applications and products made therefrom. The methods disclosed herein include new methods of gel casting to form a preform.

According to one general embodiment, a photoconductive semiconductor switch comprises a structure of sintered nanoparticles of a high band gap material exhibiting a lower electrical resistance when excited by light relative to an electrical resistance thereof when not exposed to the light.

According to another general embodiment, a method comprises creating a mixture comprising particles, at least one dopant, and at least one solvent; adding the mixture to a mold; forming a green structure in the mold; and sintering the green structure to form a transparent ceramic.

According to some embodiments, mechanical stirring, centrifugal mixing, or some other method of agitating the suspension may be used as the oxide particles are added to the solvent and/or after the oxide particles are added to the solvent to form the suspension. Also, the pH of the solvent and/or the suspension may be controlled.

Exceptional ceramic parts having laser optical transparency have been fabricated and are commercially available. These parts are typically made starting with a very pure co-precipitated powder which is then slip cast in the presence of a gelling agent to form the green structure or preform prior to sintering. A uniform slurry of high purity powder is poured into a plaster mold which sucks the water out of the slurry by capillary forces and produces the green structure after drying. Using fluid flow and surface tension to consolidate the ceramic powder allows parts to be made with a uniform powder packing. However, because the mold removes the water, slip casting can only be used for relatively thin parts. The need for a very porous surface on the mold also introduces another variable in the green structure fabrication. The porous mold, usually made of commercial gypsum, may also be a source of contamination. Moreover, the presence of the gelling agent, or its by products, in the final structure is an impurity that adversely affects the optical properties of the ceramic. Cold uniaxial pressing and cold isostatic pressing have also been used to make transparent parts. However, inter-particle friction during the pressing process tends to prevent densification in the center of the part so that size of the part must be kept small enough that this does not cause porosity.

In order to increase the driving force for sintering, a finer nano-sized powder than that produced by precipitation may be used. This can be especially important for achieving high transparency needed for lasers. Finer particles, because of their increased surface area, sinter more easily. Very small trapped pores are also less effective in scattering light.

However, smaller nano-sized particles behave differently than larger (such as micrometer) sized particles during green structure consolidation and therefore have not been previously considered for optical applications. For instance, smaller particles experience more friction as they move past one another in a die making it more difficult to produce a uniform structure through cold pressing, especially where larger parts are desired. The higher surface area of finer particles also requires more water for wetting making it difficult to get the solids loading high for slipcast slurries. As a result, after slip casting there is significant shrinkage on drying, often leading to cracking and other problems. Finer particles are more susceptible to surface-area-dependent chemical reactions, as may occur between a porous mold and certain ceramic powders. The problems associated with conventional production of green structures using nano-sized particles have been addressed in some of the methods presented herein, according to some embodiments.

Referring to FIG. 1, according to one embodiment, a photoconductive semiconductor switch 100 comprises a structure 102 of sintered nanoparticles 104 of a high band gap material exhibiting a lower electrical resistance when excited by light 106 relative to an electrical resistance thereof when not exposed to the light 106.

In some embodiments, the structure 100 may comprise silicon carbide (SiC). Any form of silicon carbide may be used, and preferably the silicon carbide may be in a powder form before being formed in the structure 100. In some further embodiments, the structure 100 may comprise a dopant 108 such as nitrogen and/or vanadium. The amount of dopant 108 that the structure 100 includes may be determined by the desired physical and electronic effects that the dopant 108 exhibits in the structure 100.

According to more embodiments, the structure 100 may comprise aluminum nitride, such as AlN nanoparticles sintered into a solid mass. In further embodiments, the structure 100 may comprise a dopant 108 such as oxygen, manganese, and/or iron. Of course, other dopants 108 may be used as well, as would be known to one of skill in the art.

In more approaches, the structure 100 may comprise gallium nitride, e.g., sintered GaN nanoparticles. In further approaches, the structure 100 may comprise a dopant 108 such as oxygen and/or iron. Of course, other dopants 108 may be used as well, as would be known to one of skill in the art.

The dopant 108 may be added to the structure 100 as the structure is being formed, may be included in a previously formed structure which can be ground up and used to form the new structure, may be introduced into the formed structure, or may be added according to any other method as would be known to one of skill in the art.

According to some embodiments, the structure 100 may be substantially free of defects. The defects may be selected from a group consisting of pipes, inclusions, and impurities. Note that the term "impurities" refers to any material not desired to be included in the structure. Also, the term "substantially free" is meant to mean greater than 95% free of defects based on a volume of the structure, and more preferably greater than 98% free of defects based on a volume of the structure, ideally greater than 99% free of defects based on a volume of the structure. Pipes are structural defects which may occur during the production of the green structure and/or ceramic, and are not desired elements.

In some approaches, the structure 100 may have a solids density greater than about 99% of a theoretical maximum density of the structure, where about 99% means 99%±1%.

In more embodiments, the structure 100 may include electrodes 110 coupled to ends of the structure 100. The electrodes 110 may be of any type known in the art, such as pads, wires, etc. The electrodes 110 may also be coupled to some other system.

The electrodes may be formed through plasma sputtering (e.g., by physical vapor depositing (PVD) a thin layer of metal onto the surface of the structure, then bonding the electrodes to this metal), chemical vapor deposition (CVD), plasma-enhanced CVD (PECVD), magnetron sputtering, flame spray pyrolysis, laser ablation, etc.

In some embodiments, the structure 100 may have a volumetric size greater than about 1 $mm^3$.

According to some more embodiments, the particles may have a mean particle diameter of less than about 1000 nanometers (1 micron) as present in the final structure. Preferably, the particles may have a mean particle diameter less than about 800 nm, more preferably less than about 500 nm, and in some approaches less than about 200 nm.

In even more approaches, the structure 100 may be able to hold back an equivalent of at least about 50 kV (e.g., 50±10 kV) per cubic mm of the structure, preferably greater than about 75 kV, and in some approaches greater than about 100 kV.

In some more approaches, the structure 100 has spatially varying properties. For example, the resistance of the structure 100 may change depending on which portion of the structure 100 is being analyzed or used. In another example, the structure 100 may react more to light 106 depending on how close to the exterior surface of the structure 100 the reaction is being tested or used. Also, the dopants 108 present in the structure 100 may be of different volumetric percentages in different portions of the structure 100. Of course, any other spatially varying property may also be exhibited by the structure 100, as would be apparent to one of skill in the art reading the present disclosure.

Figure 2:
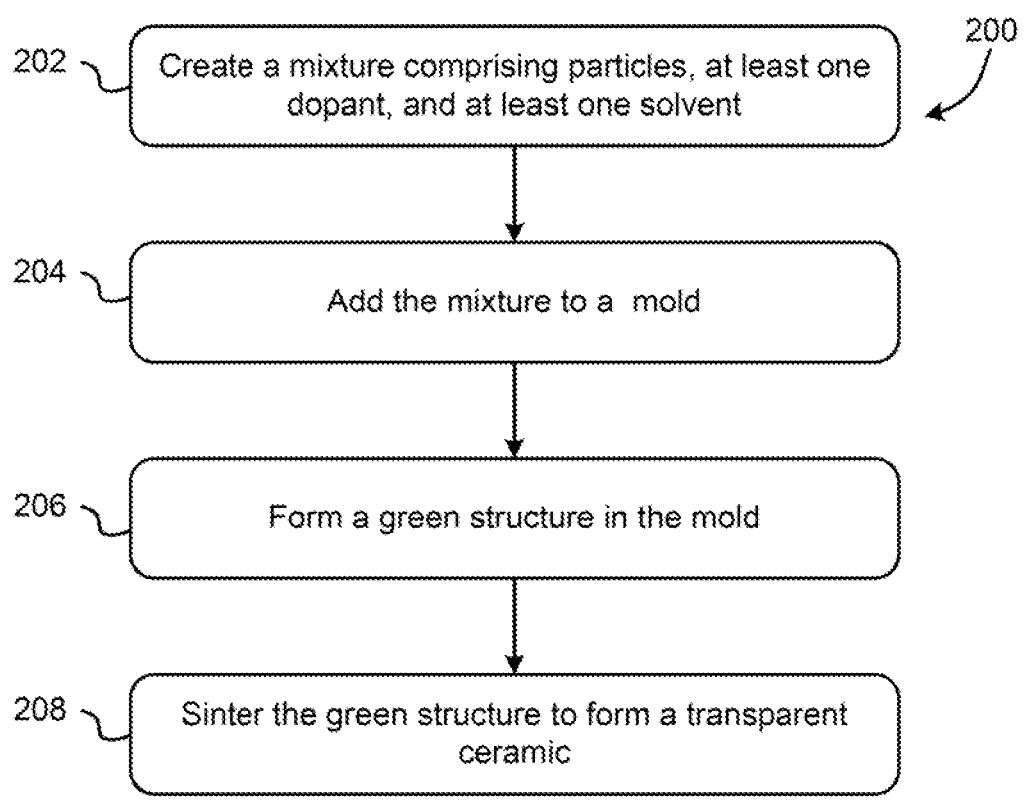
FIG. 2 is a flowchart showing a method for forming a transparent ceramic for use in photoconductive semiconductor switch applications, according to one embodiment.

Now referring to FIG. 2, a method 200 is described according to one embodiment. The method 200 may be carried, out in any environment, including those described herein. The method 200 is described in the following operations, and may include more or fewer operations than those presented below.

In operation 202, a mixture is created comprising particles, at least one dopant, and at least one solvent. Note that the particles do not necessarily dissolve in the solvent; rather, the solvent and particles typically form a slurry or suspension.

According to one embodiment, a slurry or suspension of fine to very fine particles are formed in a solvent. The solvent liquid is preferably purified de-ionized or distilled water. Other solvents can be used if they evaporate completely or nearly completely at or below 200° C., or if they decompose or are capable of being incorporated into the formed preform or green structure, without leaving any ash or residue. Some other solvents include alcohols, aldehydes, and other organic solvents.

When using an aqueous suspension of particles, the pH of the water may be adjusted to be between about 2 and about 5, or between about 8 and about 12, depending on the particles used and any additional components in the solvent. In one example, when yttrium aluminum garnet (YAG) particles that are produced via flame spray pyrolysis (FSP) are used as the oxide particles, the pH of the water may preferably be between about 9 and about 11, even more preferably about 10.5. The most preferred pH may vary depending on the oxide being suspended and may be chosen to result in a zeta-potential for the suspension as far from zero as possible to produce a good suspension.

In some approaches, the pH may be adjusted with an easily removable base or acid, and in some preferred approaches, the base may be ammonia or the acid may be nitric acid. Any other base or acid may also be used to obtain the desired pH. Additives which react with water as the gel cures in later processing, altering the pH of the solvent, are known in the prior art, and may optionally be used to adjust the pH. These include but are not limited to urea, biuret, formamide, ammonium carbamate, and insoluble additives such as aluminum nitride.

In some approaches, the particles may be prepared as a powder. This powder may be prepared using flame-spray pyrolysis (FSP). In FSP, an organo-metallic material having the stoichiometrically correct amounts of the metal ions is burned in a suitable fuel. This method for obtaining nano-sized, spherical particles is known in the prior art. In this embodiment, the smoke is comprised primarily of the desired particle powder.

Other methods for obtaining these nano-powders, such as by fuming, co-precipitation, and mixing of powders, are also possible. Other methods of forming/acquiring the particles include crushing, e.g., in a pin mixer or ball mill, purchasing the particles from a supplier, screening fines from a source; etc. Of course, any other method may be used to produce the particle powder that results in the particles having the desired particle diameter range.

In some approaches, a small amount of dispersant may be added to the suspension to achieve the solids loading for gel-casting. Some suitable organic dispersants include ammonium polymethacrylate (DARVAN C-N), an ammonium polymethacrylate, DISPEX MO, and/or a narrow molecular weight range ammonium polyacrylate. Alternatively, free metal ions such as yttrium (3+) and/or aluminum (3+) may be used as the dispersant. When free metal ions are used as the dispersant, they may be added to the solvent as a metal salt, e.g., a nitrate salt. Particular care is taken so as not to disturb the phase purity of the finished ceramic. Sodium silicate solution or other inorganic dispersants may also be suitable dispersants. In some preferred approaches, ammonium acrylate dispersants may be used, as they generally have an advantage over other dispersants in that they completely burn out during subsequent processing, thereby not leaving a residue. Enough dispersant may be added so as to stabilize the suspension and decrease a viscosity of the suspension. According to some embodiments, the amount of dispersant added to the suspension may be between 0.5 wt. % to about 3.0 wt. % of the weight of the solids when using organic dispersants, and between about 0.01 wt. % to about 0.5 wt. % of the weight of solids in the case of metal salts. The preferred weight of dispersants added to the suspension may be obtained by constructing a series and determining what level of dispersants results in the maximum solids content of the suspension. Of course, the amount of dispersant used may vary depending on the components of the suspension, and may be further refined based on experimentation.

According to some embodiments, the particles may be inorganic particles.

In some approaches, the nano-scale particle powders may preferably be spherical in morphology and/or produced via flame-spray pyrolysis (FSP). Some inorganic particles that may be used in embodiments disclosed herein include, but are not limited to, yttrium aluminum garnet (YAG), neodymium doped YAG (Nd:YAG), various other doped or un-doped rare-earth garnets including yttrium scandium aluminum garnet, lutetium aluminum garnet, gadolinium gallium garnet, etc., yttrium oxide, ytterbium doped yttrium oxide, and other doped cubic oxides including scandia, lutetia, zirconia, etc.

In more approaches, the particles may have a primary particle diameter between about 5 nm and about 2000 nm, and in some approaches, the particles may have a mean diameter of less than about 1000 nm. Even more preferably, the primary particle diameter may be between about 5 nm and about 800 nm, and even more preferably between about 10 nm and about 500 nm, and in some approaches less than about 200 nm. A primary particle diameter may include a mean particle diameter, a median particle diameter, etc.

According to some approaches, the thick suspension produced in operation 202 may be subjected to a form of high energy agitation to remove trapped air and wet all the particles thoroughly. The high energy agitation preferably is thorough and energetic enough to break up powder agglomerates and disperse the particles thoroughly and uniformly throughout the suspension. Suitable forms of high energy agitation include subjecting the suspension to an ultrasonic vibration, using a very high shear mixer, and some form of a high energy ball mill with media appropriate to break up the nano-sized and larger agglomerates. Generally, after the high energy agitation, the viscosity of the suspension drops dramatically and additional oxide particles may be added, thereby producing a suspension with an even higher weight percent of oxide particles.

The total amount of particles added to a given quantity of solvent preferably is greater than or approximately equal to the tap density of the dry particle powder, according to some embodiments. The amount of particles added is generally limited to achieve complete wetting, dispersion, and mixing of the particle powder and solvent and to have a suspension that pours freely. Nevertheless, preferable powder loading is as high as possible following the high energy agitation. Most preferably, the suspension may be composed of at least about 15 vol. % particles or higher. In other approaches, the suspension may be composed of between about 15 vol. % to about 60 vol. % particles, more preferably between about 15 vol. % to about 50 vol. % particles, even more preferably between about 25 vol. % to about 45 vol. % particles.

In operation 204, the mixture is added to a mold. Any type of mold may be used, depending on the desired shape of the transparent ceramic after curing. Preferably, the mold may be in a shape amenable to producing a transparent ceramic photo-optical semiconductor high power switch. In one preferred approach, the mold is impermeable.

In more embodiments, the mold may be amenable to producing an intermediate structure, which can then be cut, shaped, ground, chipped, or otherwise processed such as to produce a desired shape after processing.

One of the advantages of this method to produce transparent ceramic performs is that many shapes may be achieved beyond that possible through conventionally used methods, which are generally limited to flat shapes due to the high pressure conditions used in the processing. In the present approach, the mixture may be allowed to gel in the mold until stable. The mold may be designed such that the stable mixture may be removed therefrom without excessive stresses being exerted on the mixture, thereby resulting in less chance of the stable mixture being harmed upon removal from the mold.

In operation 206, a green structure is formed in the mold, e.g., by curing, preferably under pressure or not under pressure. Any pressure or partial vacuum may be used as would be known to one of skill in the art to impose different properties on the green structure.

Curing preferably continues without drying until the green structure is removed from the mold, resulting in no damage to the green structure. In some approaches, curing may occur for between about 12 to about 72 hours (or longer) at room temperature (e.g., about 20° C.). In other approaches, the curing may occur for between about 4 hours to about 24 hours (or longer) at elevated temperatures, with the conditions preferably being chosen such that no gas is evolved from the suspension (except for potentially negligible evaporation), e.g., via boiling or via dissociation of carbonic acid.

In some more approaches, the curing may take place under a pressure higher than atmospheric pressure. Preferably, the suspension may be allowed to cure in a sealed container for between about 40 hours to about 84 hours at between about 20° C. to about 80° C. In other approaches, between about 40° C. and about 60° C., and most preferably, the suspension may be allowed to cure in a sealed container for between about 8 hours and about 100 hours at a temperature of about 50° C. In one preferred embodiment, the suspension is cured in a sealed container (possibly the mold) at a temperature of about 50° C. for a period of time of about 72 hours. Of course, the temperature may vary during the curing, but the temperature may be held at about a constant temperature.

In addition to enabling gelation of the suspension in the mold, the high loading may result in less shrinkage during drying and thereby result in less susceptibility to cracking. This is in contrast to prior art methods of gelation, where drying during gelation may lead to cracking of the green structure. The gelled green structure may be dried in a fashion that is slow and uniform, such that the risk of cracking is substantially reduced. More preferably, the drying green structure may be supported in such a way that all surfaces have similar access to air, and the drying may occur at room temperature (about 20° C.) until shrinkage ceases. Further, drying may be performed at an elevated temperature below the boiling point of the liquid according to some embodiments.

In some embodiments, any remaining solvent may be drained from the green structure after the curing, and additional solvent may be added to the green structure prior to sintering to form a ceramic. The original solvent may be the same or different than the newly added solvent, and additional solvents may be added in successive drying steps, thereby allowing about complete replacement of any remaining original solvent in the green structure with newly added solvent, prior to sintering to form a ceramic.

The dried green structure may be handled after the drying. In some embodiments, the green structure may be calcined. Calcination may comprise firing the green structure in air at a temperature of between about 500° C. and about 1100° C. to remove any residual organic compounds or other residual substances and to create any desired phase change.

In operation 208, the green structure is sintered to form a transparent ceramic. Any method of sintering may be used as would be known to one of skill in the art (polishing may be used to aid in producing the transparency of the ceramic). According to some more embodiments, the sintering may include spark plasma sintering.

In some approaches, no gelling additive is added to the mixture to form the green structure. One unique aspect of the methods for preform production described herein is that no effective amount of a polymer, binder, and/or other gelling agent may be added to the solvent and preferably none is present at all. For example, the preform may be formed without the aid of the binder and/or polymer and/or gelling agent (used interchangeably herein). A "gelling agent" as used herein is generally defined as any material that promotes agglomeration of the particles. In addition, many gelling agents exhibit at least one of the following properties: non-evaporative at 50° C.; is capable of, or would tend to exhibit, crosslinking at some point after addition. In contrast, typical gel-casting methods require one of these gelling agents to be added in order to properly gel.

The method 200 may further comprise, according to some approaches, hot isostatically pressing the sintered structure, wherein the sintered structure may have a solids density greater than about 99% of a theoretical maximum density of the structure after the pressing.

According to some approaches, the method 200 may further comprise forming electrodes on at least a portion of the sintered structure, such as a piece of the structure cut to a specific size.

The mixture may comprise silicon carbide in some embodiments, and the at least one dopant may be selected from a group consisting of nitrogen and vanadium. Of course, other dopants may be used also.

The mixture may also comprise aluminum nitride, and the at least one dopant may be selected from a group consisting of oxygen, manganese, and iron. Of course, other dopants may be used also.

The mixture comprises gallium nitride, in some approaches. In addition, the at least one dopant may be selected from a group consisting of oxygen and iron. Of course, other dopants may be used also.

According to several approaches, high power photoconductive switches may be extremely useful to high power electronics industries in both defense and commercial applications. For commercial purposes, affordable photo-optical switches may be highly desired for the development of a compact proton accelerator for radiotherapy treatment of cancer. Also, as far as defense applications go, directed energy weapons may use these switches to create and direct the energy used in these weapons.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A photoconductive semiconductor switch, comprising:
a structure of sintered nanoparticles of a high band gap material exhibiting a lower electrical resistance when excited by light relative to an electrical resistance thereof when not exposed to the light.

2. The photoconductive semiconductor switch of claim 1, wherein the structure comprises silicon carbide.

3. The photoconductive semiconductor switch of claim 2, wherein the structure further comprises a dopant selected from a group consisting of nitrogen and vanadium.

4. The photoconductive semiconductor switch of claim 3, wherein the dopant is nitrogen.

5. The photoconductive semiconductor switch of claim 1, wherein the structure comprises aluminum nitride.

6. The photoconductive semiconductor switch of claim 5, wherein the structure further comprises a dopant selected from a group consisting of oxygen, manganese and iron.

7. The photoconductive semiconductor switch of claim 6, wherein the dopant is selected from the group consisting of: manganese and oxygen.

8. The photoconductive semiconductor switch of claim 1, wherein the structure comprises gallium nitride.

9. The photoconductive semiconductor switch of claim 8, wherein the structure further comprises a dopant selected from a group consisting of oxygen and iron.

10. The photoconductive semiconductor switch of claim 8, wherein the dopant is oxygen.

11. The photoconductive semiconductor switch of claim 1, wherein the structure is substantially free of defects selected from a group consisting of pipes, inclusions and impurities.

12. The photoconductive semiconductor switch of claim 1, wherein the structure has a solids density greater than about 99% of a theoretical maximum density of the structure.

13. The photoconductive semiconductor switch of claim 1, further comprising electrodes coupled to ends of the structure.

14. The photoconductive semiconductor'switch of claim 1, where the structure has a volumetric size greater than about 1 $mm^3$.

15. The photoconductive semiconductor switch of claim 1, wherein the nanoparticles have a mean particle diameter of less than about 1000 nanometers.

16. The photoconductive semiconductor switch of claim 1, wherein the structure is able to hold back an equivalent of at least about 50 kV per 1 $mm^3$ of the structure.

17. The photoconductive semiconductor switch of claim 1, wherein the structure has spatially varying properties.

18. A method for creating the photoconductive semiconductor switch of claim 1, the method comprising:
creating a mixture comprising particles, at least one dopant, and at least one solvent;
adding the mixture to a mold;
forming a green structure in the mold; and
sintering the green structure to form a ceramic.

19. The method of claim 18, with the proviso that no gelling additive is added to the mixture.

20. The method of claim 18, further comprising hot isostatically pressing the sintered structure, wherein the sintered structure has a solids density greater than about 99% of a theoretical maximum density of the structure after the pressing.

21. The method of claim 18, wherein the mixture comprises silicon carbide.

22. The method of claim 21, wherein the at least one dopant is selected from a group consisting of nitrogen and vanadium.

23. The method of claim 18, wherein the mixture comprises aluminum nitride.

24. The method of claim 23, wherein the at least one dopant is selected from a group consisting of oxygen, manganese and iron.

25. The method of claim 18, wherein the mixture comprises gallium nitride.

26. The method of claim 25, wherein the at least one dopant is selected from a group consisting of oxygen and iron.

27. The photoconductive semiconductor switch of claim 1, further comprising electrodes coupled to ends of the structure,
wherein the structure comprises a material selected from the group consisting of:
silicon carbide and a dopant selected from the group consisting of vanadium and nitrogen; and
aluminum nitride and a dopant selected from the group consisting of oxygen and manganese,
wherein the structure is able to hold back an equivalent of at least about 100 kV per 1 $mm^3$ of the structure,
wherein the structure has a volumetric size greater than about 1 $mm^3$,
wherein the nanoparticles have a mean particle diameter of less than about 1000 nanometers,
wherein the structure has a solids density greater than about 99% of a theoretical maximum density of the structure, and
wherein the structure is substantially free of defects selected from a group consisting of pipes, inclusions and impurities.

* * * * *